United States Patent
Li et al.

(10) Patent No.: US 12,062,305 B2
(45) Date of Patent: Aug. 13, 2024

(54) TEST CIRCUIT, ARRAY SUBSTRATE, AND DISPLAY PANEL

(71) Applicants: Hefei Xinsheng Optoelectronics Technology Co., Ltd., Hefei (CN); BOE TECHNOLOGY GROUP CO., LTD., Beijing (CN)

(72) Inventors: Guangyao Li, Beijing (CN); Dongfang Wang, Beijing (CN)

(73) Assignees: Hefei Xinsheng Optoelectronics Technology Co., Ltd., Anhui (CN); BOE TECHNOLOGY GROUP CO., LTD., Beijing (CN)

( * ) Notice: Subject to any disclaimer, the term of this patent is extended or adjusted under 35 U.S.C. 154(b) by 315 days.

(21) Appl. No.: 17/429,310

(22) PCT Filed: Jan. 5, 2021

(86) PCT No.: PCT/CN2021/070364
§ 371 (c)(1),
(2) Date: Aug. 6, 2021

(87) PCT Pub. No.: WO2021/139658
PCT Pub. Date: Jul. 15, 2021

(65) Prior Publication Data
US 2022/0108641 A1    Apr. 7, 2022

(30) Foreign Application Priority Data
Jan. 6, 2020  (CN) .......................... 202010010556.4

(51) Int. Cl.
*G09G 3/00*    (2006.01)
*H10K 59/121*  (2023.01)
*H10K 59/131*  (2023.01)

(52) U.S. Cl.
CPC ......... *G09G 3/006* (2013.01); *H10K 59/1213* (2023.02); *H10K 59/1216* (2023.02); *H10K 59/131* (2023.02)

(58) Field of Classification Search
CPC ....................................................... G09G 3/006
(Continued)

(56) References Cited

U.S. PATENT DOCUMENTS

| 6,275,061 B1 * | 8/2001 | Tomita ................... G09G 3/006 |
| | | 324/760.02 |
| 9,406,251 B2 | 8/2016 | Shao et al. |

(Continued)

FOREIGN PATENT DOCUMENTS

| CN | 101174038 A | 5/2008 |
| CN | 101533593 A | 9/2009 |

(Continued)

OTHER PUBLICATIONS

International Search Report and Written Opinion for International Application No. PCT/CN2021/070364 Mar. 26, 2021.
First Office Action for CN Patent Application No. 202010010556.4 mailed Feb. 1, 2021.
Second Office Action for CN Patent Application No. 202010010556.4 mailed Sep. 7, 2021.

*Primary Examiner* — Vincent Q Nguyen
(74) *Attorney, Agent, or Firm* — Perilla Knox & Hildebrandt LLP; Kenneth A. Knox (57) ABSTRACT

A test circuit includes a plurality of first switch units and a plurality of second switch units. The first switch units are provided in one-to-one correspondence with a plurality of signal lines. First terminals of the first switch units are connected to first ends of the plurality of signal lines, second terminals of the first switch units are short-circuited to one another, and control terminals of the first switch units are connected to a first control signal terminal. The plurality of second switch units are provided in one-to-one correspondence with the plurality of signal lines. First terminals of the (Continued)

plurality of second switch units are connected to second ends of the plurality of signal lines, second terminals of the plurality of second switch units are short-circuited to one another, and control terminals of the plurality of second switch units are connected to a second control signal terminal.

17 Claims, 4 Drawing Sheets

(58) Field of Classification Search
USPC ............... 324/760.01, 760.02; 345/92, 206
See application file for complete search history.

(56) References Cited

U.S. PATENT DOCUMENTS

| | | | |
|---|---|---|---|
| 2005/0046439 | A1 | 3/2005 | Yu |
| 2015/0325158 | A1 | 11/2015 | Shao et al. |
| 2018/0083051 | A1* | 3/2018 | Chan ................ H01L 27/124 |
| 2021/0183282 | A1* | 6/2021 | Jiang ................ H10K 59/131 |

FOREIGN PATENT DOCUMENTS

| | | |
|---|---|---|
| CN | 101639508 A | 2/2010 |
| CN | 101174038 B | 5/2010 |
| CN | 101533593 B | 1/2011 |
| CN | 101963709 A | 2/2011 |
| CN | 103217844 A | 7/2013 |
| CN | 203055406 U | 7/2013 |
| CN | 105575301 A | 5/2016 |
| CN | 205282049 U | 6/2016 |
| CN | 107329298 A | 11/2017 |
| CN | 208157016 U | 11/2018 |
| CN | 109493770 A | 3/2019 |
| CN | 111179794 A | 5/2020 |
| EP | 2983039 A1 | 2/2016 |
| EP | 2983039 B1 | 2/2019 |
| JP | H0320782 A | 1/1991 |
| JP | H08110531 A | 4/1996 |
| JP | 2594358 B2 | 3/1997 |

* cited by examiner

TEST CIRCUIT, ARRAY SUBSTRATE, AND DISPLAY PANEL

CROSS REFERENCE TO RELATED APPLICATION

The present application is a national phase application under 35 U.S.C. § 371 of International Application No. PCT/CN2021/070364, filed on Jan. 5, 2021, which claims the benefit of and priority to Chinese Patent Application No. 202010010556.4 entitled "TEST CIRCUIT, ARRAY SUBSTRATE, AND DISPLAY PANEL", filed Jan. 6, 2020, the contents of both of which are hereby fully incorporated by reference as part of the present application.

TECHNICAL FIELD

The present disclosure relates to display technologies, and more particularly to, a test circuit, an array substrate, and a display panel.

BACKGROUND

Generally, various kinds of signal lines are integrated on an array substrate, and include at least one kind of gate line and various kinds of data lines. For example, gate lines may include signal lines configured to provide gate electrode drive signals to pixel drive circuits, and signal lines configured to provide control signals to gate electrodes of sensing transistors in the pixel drive circuits. The data lines may include signal lines for providing data signals to the pixel drive circuits, signal lines for providing power supply signals to the pixel drive circuits, and sensing signal lines connected to source/drain electrodes of the sensing transistors in the pixel drive circuits. Since signal lines are integrated densely on the array substrate, shorting easily occurs between the signal lines on the array substrate, and disconnection of the signal lines themselves easily occurs either, which results in poor display.

It should be noted that information disclosed in BACKGROUND are provided only for acquiring a better understanding of the background of the present disclosure, and therefore may include information that is not current technology already known to those of ordinary skill in the art.

SUMMARY

According to an aspect of the present disclosure, there is provided a test circuit, applied to an array substrate, wherein the array substrate includes a plurality of signal lines, and the test circuit includes a plurality of first switch units and a plurality of second switch units provided in one-to-one correspondence with the plurality of signal lines. The plurality of first switch units are provided in one-to-one correspondence with the plurality of signal lines, first terminals of the first switch units are connected to first ends of the plurality of signal lines, second terminals of the first switch units are short-circuited to one another, and control terminals of the first switch units are connected to a first control signal terminal; and the plurality of second switch units are provided in one-to-one correspondence with the plurality of signal lines, first terminals of the second switch units are connected to second ends of the plurality of signal lines, second terminals of the second switch units are short-circuited to one another, and control terminals of the second switch units are connected to a second control signal terminal.

In an exemplary embodiment of the present disclosure, the test circuit further includes first connection lines, each of the first connection lines is provided between one of the first switch units and one of the plurality of signal lines, and the first connection line is connected between the first terminal of the first switch unit and the one of the plurality of signal lines; and the test circuit further includes second connection lines, each of the second connection lines is provided between one of the second switch units and one of the plurality of signal lines, and the second connection line is connected between the first terminal of the second switch unit and the one of the plurality of signal lines.

In an exemplary embodiment of the present disclosure, the array substrate includes a wiring region located in periphery of a display region, and the first switch units, the second switch units, the first connection lines and the second connection lines are provided in the wiring region. The periphery of the display region may refer to one side, a plurality of sides of the display region, or a circle around the display region.

In an exemplary embodiment of the present disclosure, the first switch units include: first transistors, wherein first terminals of the first transistors are connected to the first ends of the plurality of signal lines, second terminals of the first transistors are short-circuited to one another, and control terminals of the first transistors are connected to the first control signal terminals; and the second switch units include: second transistors, wherein first terminals of the second transistors are connected to the second ends of the plurality of signal lines, second terminals of the second transistors are short-circuited to one another, and control terminals of the second transistors are connected to the second control signal terminals.

In an exemplary embodiment of the present disclosure, the first transistors and the second transistors are provided on a same layer as transistors in the display region.

In an exemplary embodiment of the present disclosure, the first connection lines and the second connection lines are located in a source/drain layer of the array substrate, and the first connection lines and the second connection lines are connected to the gate lines through via-holes.

In an exemplary embodiment of the present disclosure, the test circuit further includes first shorting lines and second shorting lines provided in one-to-one correspondence with the plurality of signal lines, wherein the first shorting lines are located on a first conductive layer of the array substrate, and are connected to the second terminals of the first switch units through via-holes; and the second shorting lines are located on the first conductive layer of the array substrate, and are connected to the second terminals of the second switch units through via-holes, wherein the first conductive layer is located on a different layer from a source/drain layer of the array substrate.

In an exemplary embodiment of the present disclosure, the first conductive layer is a gate electrode layer of the array substrate.

In an exemplary embodiment of the present disclosure, the test circuit further includes first control lines and second control lines provided in one-to-one correspondence with the plurality of signal lines, wherein the first control lines are located on the gate electrode layer of the array substrate, and connected to the control terminals of the first switch units; and the second control lines are located on the gate electrode layer of the array substrate, and are connected to the control terminals of the second switch units.

In an exemplary embodiment of the present disclosure, the test circuit further includes a plurality of first probe pads and a plurality of second probe pads provided in one-to-one correspondence with the plurality of signal lines, wherein the plurality of first probe pads are provided on a surface of the array substrate, and are connected to the first control lines; and the plurality of second probe pads are provided on the surface of the array substrate, and are connected to the second control lines.

In an exemplary embodiment of the present disclosure, the plurality signal lines include gate lines, data lines, or a combination of the gate lines and the data lines.

According to an aspect of the present disclosure, there is provided an array substrate comprising the test circuit described above.

In an exemplary embodiment of the present disclosure, a pixel drive circuit in the array substrate includes a storage capacitor and a drive transistor, wherein an electrode of the storage capacitor connected to a source/drain electrode of the drive transistor is located in a source/drain layer of the array substrate.

According to an aspect of the present disclosure, there is provided a display panel comprising the array substrate described above.

It is to be understood that both the foregoing general description and the following detailed description are exemplary and explanatory only and are not restrictive of the disclosure, as claimed.

BRIEF DESCRIPTION OF THE DRAWINGS

The accompanying drawings, which are incorporated in and constitute a part of this specification, illustrate embodiments consistent with the disclosure and, together with the description, serve to explain the principles of the disclosure. Apparently, the drawings in the following description are only for illustrating some embodiments of the present disclosure, and those of ordinary skill in the art can derive other drawings based on the drawings without paying any creative labor as well.

DETAILED DESCRIPTION

Exemplary embodiments will now be described more fully by reference to the accompanying drawings. However, the exemplary embodiments can be implemented in various forms, and should not be understood as being limited to the examples set forth herein; rather, the embodiments are provided so that this disclosure will be thorough and complete, and the conception of the exemplary embodiments will be fully conveyed to those skilled in the art. The same reference numbers will be used throughout the drawings to refer to the same or like structures and detailed descriptions thereof will be omitted.

Although terms having opposite meanings such as "above" and "under" are used herein to describe the relationship of one component relative to another component, such terms are used herein only for the sake of convenience, for example, in the direction illustrated in the drawings. It is to be understood that if a device denoted in the drawings is turned upside down, a component described as "above" something will become a component described as "under" something. Other words having opposite meanings such as "high", "low", "top", "bottom", "left", and "right" have similar meanings as well. When a structure is described as "above" another structure, it probably means that the structure is integrally formed on another structure, or, the structure is "directly" disposed on another structure, or, the structure is "indirectly" disposed on another structure through an additional structure.

Words such as "one", "an/a", and "the" are used herein to indicate the presence of one or more elements/component parts/and others. Terms such as "including" and "having" have an inclusive meaning which means that there may be additional elements/component parts/and others in addition to the listed elements/component parts/and others.

Figure 1:
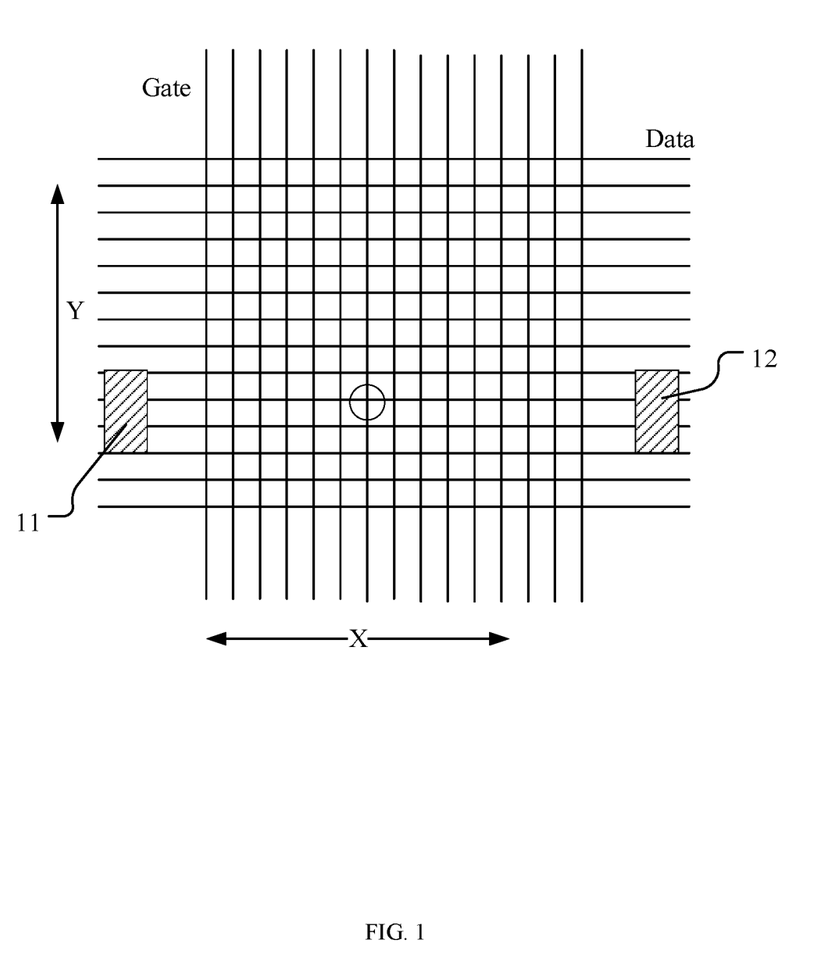
FIG. 1 is a structural schematic diagram for illustrating an SD OS test method in the related technology.

In the related technology, generally, deficiency of signal lines in an array substrate may be detected by a SD OS test or a SD AT test. Specifically, the SD OS test may be used for short-circuit detection between a gate line and a data line (GDS detection), disconnection detection of a gate line or a data line (Open detection), and short-circuit detection among data lines (DDS detection). In the GDS detection, gate lines and data lines need to be suspended respectively (the same kind of gate lines are separately disposed, and the same kind of data lines are separately disposed), so as to detect whether there is a short circuit between the data line and the gate line by a detection tool. In the Open detection, the same ends of the same kind of gate lines need to be in shorted connection respectively, and the same ends of the same kind of data lines need to be in shorted connection respectively, so as to detect whether there is an open circuit in the gate lines or in the data lines by the detection tool. In the DDS detection, the same ends of a kind of data lines need to be disposed in a short-circuit state respectively, and a kind of adjacent data lines are disposed in a suspended state, so as to detect where there is a short circuit between the data line and the gate line by the detection tool. As shown in FIG. 1, it is a structural schematic diagram for illustrating an SD OS test method in the related technology. The array substrate includes data lines Data extending along a first direction X, and gate lines Gate extending along a second direction Y. The detection tool includes a signal sending device 11 and a signal receiving device 12. Description will be made by taking the Open detection of the data lines as an example, the signal sending device 11 is close to first ends of the data signal lines Data and emits a pulse signal, the data line Data senses and generates a corresponding pulse signal, the signal receiving device 12 is disposed close to second ends of the data lines Data and senses and generates a corresponding pulse signal according to the pulse signal on the data lines Data. Therefore, whether there is disconnection on the data lines Date may be determined by the pulse signal sensed and generated by the signal receiving device 12. For example, when the data line is disconnected in the circled position in FIG. 1, the pulse signal sensed by the signal receiving device 12 will be weakened. Similarly, the detection tool can perform DDS detection and GDS detection as well.

Figure 2:
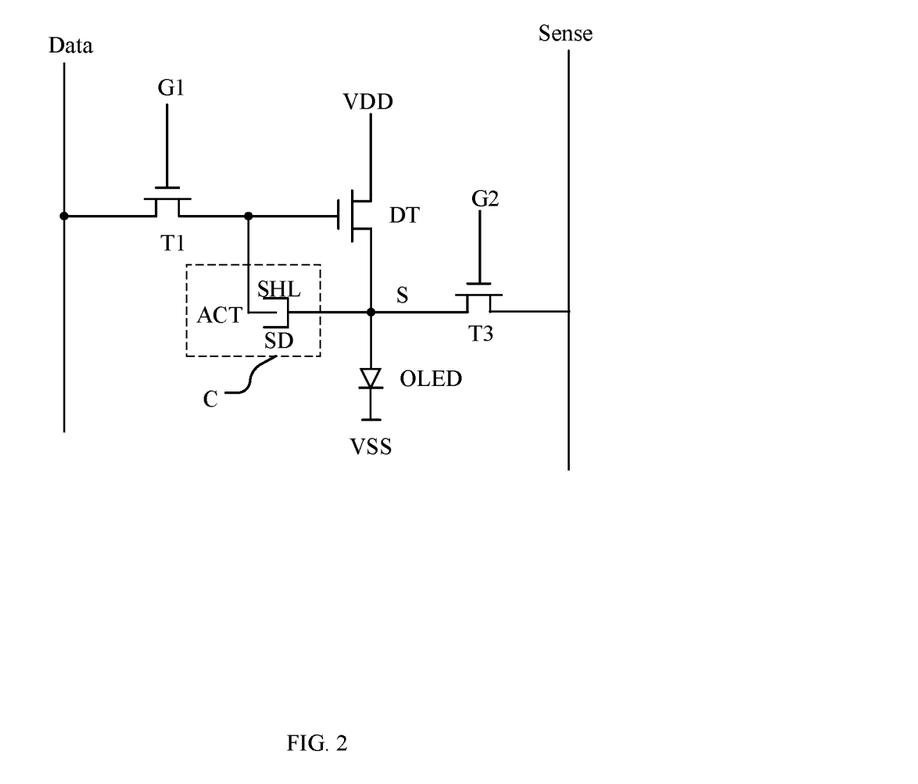
FIG. 2 is a structural schematic diagram illustrating a pixel drive circuit in the related technology.

The SD AT test is capable of detecting dot and line Mura defects in the array substrate. As shown in FIG. 2, it is a structural schematic diagram illustrating a pixel drive circuit in the related technology. The pixel drive circuit includes a first transistor T1, a drive transistor DT, a storage capacitor C and a third transistor T3. The storage capacitor C includes an electrode SD, an electrode SHL and an electrode ACT, wherein the electrode SD is electrically connected to the electrode SHL to form two capacitor structures in parallel.

The first transistor T1 has a first terminal connected to a data signal terminal Data, and a gate electrode connected to a gate electrode drive signal terminal G1. The drive transistor DT has a gate electrode connected to a second terminal of the first transistor, a first terminal connected to a power supply signal terminal VDD, and a second terminal connected to a light emitting unit OLED. The storage capacitor C is connected between the gate electrode and the second terminal of the drive transistor DT. The third transistor T3 has a gate electrode connected to a sensing drive signal terminal G2, a first terminal connected to a sensing signal terminal Sense, and a second terminal connected to the second terminal of the drive transistor DT. The SD AT test refers to the detection of dot and line Mura defects on the array substrate by sensing voltage at point S (i.e. the second terminal of the drive transistor) by the detection tool in different drive states. For example, when the SD AT test is performed, the same ends of each kind of signal lines are short connected respectively, for example, a plurality of gate lines configured to provide the gate electrode drive signal terminal G1 in a display panel are short connected, and a plurality of data signal lines configured to provide the data signal terminal Data in the display panel are short connected. A low level voltage is input to the gate lines and a high level voltage is input to the data lines, and when there is no short circuit between the gate line and the data line, the first transistor T1 is turned off, and the voltage at point S is at a low level, and when the data line and the gate line are short-circuited, the gate line is at a high level, the first transistor T1 is turned on, and the voltage at point S is at a high level. Therefore, the level at point S may be used to determine whether the data line and the gate line are short-circuited at the position. In addition, other defects may be detected by the voltage at point S in cooperation with other drive methods as well.

However, in the above-mentioned SD OS test and SD AT test, the signal lines in the array substrate need to be short-circuited or suspended in different manners, therefore, in the related technology, only one of the detection methods of SD OS and SD AT can be used for the array substrate.

Based on the above, this exemplary embodiment provides a test circuit, applied to an array substrate, wherein the array substrate includes a plurality kind of signal lines, the plurality kind of signal lines include at least one kind of gate line and a plurality kind of data lines, each kind of signal lines includes a plurality of signal lines. The test circuit includes a plurality of first switch units and a plurality of second switch units provided in one-to-one correspondence with each kind of the signal lines. The plurality of first switch units are provided in one-to-one correspondence with the signal lines, wherein first terminals of the first switch units are connected to first ends of the respective signal lines, second terminals of the first switch units are short-circuited to one another, and control terminals of the first switch units are connected to a first control signal terminal; and the plurality of second switch units are provided in one-to-one correspondence with the respective signal lines, wherein first terminals of the second switch units are connected to second ends of the respective signal lines, second terminals of the second switch units are short-circuited to one another, and control terminals of the second switch units are connected to a second control signal terminal.

This exemplary embodiment controls short-circuit or suspended states of each kind of signal line, by controlling the turn-on/turn-off of the first switch units and the second switch units corresponding to each kind of signal lines. Therefore, the test circuit can realize the respective detections of the SD OS test of the array substrate, and the SD AT test of the array substrate.

In this exemplary embodiment, the gate lines may include signal lines for providing a gate electrode drive signal to the gate electrode drive signal terminal (e.g. G1 in FIG. 2) of the pixel drive circuit, and signal lines for providing a control signal to a gate electrode of a sensing transistor (e.g. T3 in FIG. 2) in the pixel drive circuit. The data lines may include signal lines for providing a data signal to the data signal terminal (e.g. the data signal terminal Data in FIG. 2) of the pixel drive circuit, signal lines for providing a power supply signal to the power supply signal terminal (e.g. the power supply signal terminals VDD and VSS in FIG. 2) of the pixel drive circuit, and signal lines (e.g. the sensing signal terminal Sense in FIG. 2) connected to a source/drain electrode of the sensing transistor in the pixel drive circuit. It should be understood that the gate lines and data lines may include other kinds of signal lines as well. For example, signal lines extending horizontally on the array substrate may be referred to as gate lines, and signal lines extending columnwise on the array substrate may be referred to as data lines.

Hereinafter, this exemplary embodiment will be described by taking an example in which the gate lines include first gate lines G1 and second gate lines G2 and the data lines include first data lines D1, second data lines D2 and third data lines D3.

Figure 3:
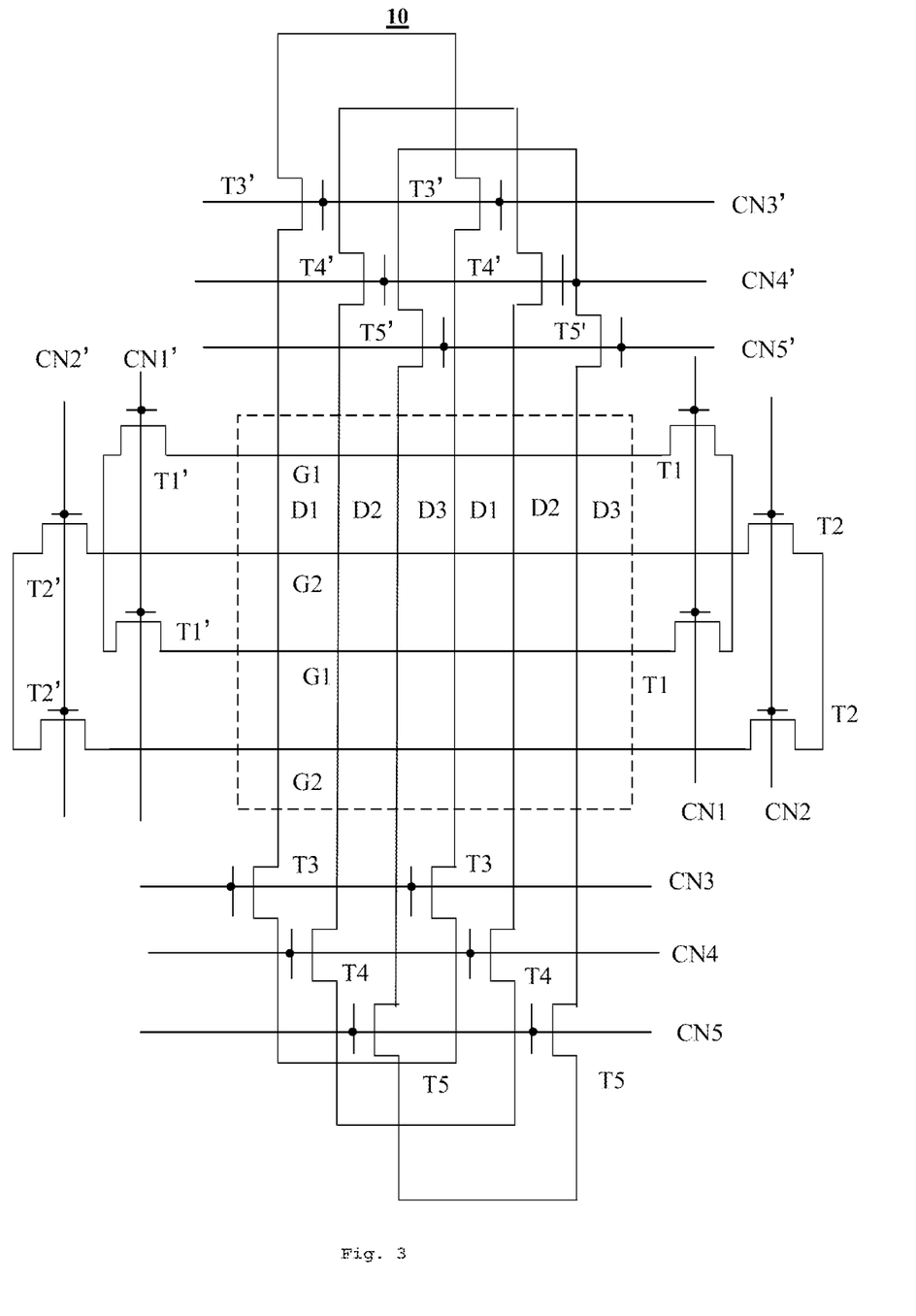
FIG. 3 is a structural schematic diagram of an exemplary embodiment of a test circuit of the present disclosure.

As shown in FIG. 3, it is a structural schematic diagram of one exemplary embodiment of a test circuit of the present disclosure. In the array substrate 10, the gate lines include a plurality of first gate lines G1 and a plurality of second gate lines G2, and the data lines include a plurality of first data lines D1, a plurality of second data lines D2 and a plurality of third data lines D3. The first gate lines G1 and the second gate lines G2 are spaced apart in sequence, and the first data lines D1, the second data lines D2 and the third data lines D3 are spaced apart in sequence. The test circuit may include a plurality of switch units T1, a plurality of switch units T1', a plurality of switch units T2, a plurality of switch units T2', a plurality of switch units T3, a plurality of switch units T3', a plurality of switch units T4, a plurality of switch units T4', a plurality of switch units T5 and a plurality of switch units T5'. The switch units T1 and the switch units T1' are provided in one-to-one correspondence with the first gate lines G1. The switch units T2 and the switch units T2' are provided in one-to-one correspondence with the second gate lines G2. The switch units T3 and the switch units T3' are provided in one-to-one correspondence with the first data lines D1. The switch units T4 and the switch units T4' are provided in one-to-one correspondence with the second data lines D2. The switch units T5 and the switch units T5' are provided in one-to-one correspondence with the third data lines D3. First terminals of the switch units T1 are connected to first ends of the corresponding first gate lines G1, second terminals of the switch units T1 are short-circuited to one another, and control terminals of the switch units T1 are connected to a control terminal CN1. First terminals of the switch unit T1' are connected to second ends of the corresponding first gate lines G1, second terminals of the switch unit T1' are short-circuited to one another, and control terminals of the switch unit T1' are connected to a control terminal CN1'. First terminals of the switch units T2 are connected to first ends of the corresponding second gate lines G2, second terminals of the switch units T2 are short-circuited to one another, and control terminals of the switch units T2 are connected to a control terminal CN2. First terminals of the switch units T2' are connected to second ends of the corresponding second gate lines G2, second terminals of the switch units T2' are short-circuited to one another, and control terminals of the switch units T2' are connected to a control terminal CN2'. First terminals of the switch units T3 are connected to first ends of the corresponding first data lines D1, second terminals of the switch units T3 are short-circuited to one another, and control terminals of the switch units T3 are connected to a control terminal CN3. First terminals of the switch units T3' are connected to second ends of the corresponding first data lines D1, second terminals of the switch units T3' are short-circuited to one another, and control terminals of the switch units T3' are connected to a control terminal CN3'. First terminals of the switch units T4 are connected to first ends of the corresponding second data lines D2, second terminals of the switch units T4 are short-circuited to one another, and control terminals of the switch units T4 are connected to a control terminal CN4. First terminals of the switch units T4' are connected to second ends of the corresponding second data lines D2, second terminals of the switch units T4' are short-circuited to one another, and control terminals of the switch units T4' are connected to a control terminal CN4'. First terminals of the switch units T5 are connected to first ends of the corresponding third data lines D3, second terminals of the switch units T5 are short-circuited to one another, and control terminals of the switch units T5 are connected to a control terminal CN5. First terminals of the switch units T5' are connected to second ends of the corresponding third data lines D3, second terminals of the switch units T5' are short-circuited to one another, and control terminals of the switch units T5' are connected to a control terminal CN5'.

In this exemplary embodiment, the switch units T1, the switch units T1', the switch units T2, the switch units T2', the switch units T3, the switch units T3', the switch units T4, the switch units T4', the switch units T5 and the switch units T5' may be P-type transistors or N-type transistors. In this exemplary embodiment, description will be made by taking N-type transistors as an example.

In the GDS detection by the test circuit, a low level signal may be input to the control terminals CN1, CN1', CN2, CN2', CN3, CN3', CN4, CN4', CN5 and CN5', the switch units T1, the switch units T1', the switch units T2, the switch units T2', the switch units T3, the switch units T3', the switch units T4, the switch units T4', the switch units T5 and the switch units T5' are turned off, and the first gate lines G1, the second gate lines G2, the first data lines D1, the second data lines D2 and the third data lines D3 are kept in the suspended state. In the Open detection by the test circuit, a high level signal may be input to the control terminals CN1, CN1', CN2, CN2', CN3, CN3', CN4, CN4', CN5 and CN5', the switch units T1, the switch units T1', the switch units T2, the switch units T2', the switch units T3, the switch units T3', the switch units T4, the switch units T4', the switch units T5 and the switch units T5' are turned on, the same ends of the first gate lines G1 are short-circuited to one another, the same ends of the second gate lines G2 are short-circuited to one another, the same ends of the first data lines D1 are short-circuited to one another, the same ends of the second data lines D2 are short-circuited to one another, and the same ends of the third data lines D3 are short-circuited to one another. In the DDS detection by the test circuit, a low level signal is input to the control terminals CN1, CN1', CN2 and CN2', the switch units T1, the switch units T1', the switch units T2 and the switch units T2' are turned off, and the first gate lines G1 and the second gate lines G2 are kept in the suspended state. A high level signal is input to the control terminals CN3 and CN3', the switch units T3 and the switch units T3' are turned on, the same ends of the first data lines D1 are kept in a short-circuited state. A low level signal is input to the control terminals CN4 and CN4', the switch units T4 and the switch units T4' are turned off, and the second data lines D2 are kept in the suspended state. A high level signal is input to the control terminals CN5 and CN5', the switch units T5 and the switch units T5' are turned on, and the same ends of the third data lines D3 are kept in the short-circuited state. In the SD AT test by the test circuit, a high level signal may be input to the control terminals CN1, CN1', CN2, CN2', CN3, CN3', CN4, CN4', CN5 and CN5', the switch units T1, the switch units T1', the switch units T2, the switch units T2', the switch units T3, the switch units T3', the switch units T4, the switch units T4', the switch units T5 and the switch units T5' are turned on, the same ends of the first gate lines G1, the same ends of the second gate lines G2, the same ends of the first data lines D1, the same ends of the second data lines D2, and the same ends of the third data lines D3 are respectively kept in the short-circuited state.

This exemplary embodiment may control the short-circuit or suspended states of each kind of the signal lines described above, by controlling the turn-on and turn-off of the switch units T1 and T1' corresponding to the first gate lines G1, the switch units T2 and T2' corresponding to the second gate lines G2, the switch units T3 and T3' corresponding to the first data lines D1, the switch units T4 and T4' corresponding to the first data lines D2, and the switch units T5 and T5' corresponding to the third data lines D3. Therefore, the test circuit can realize the respective detections of the SD OS test of the array substrate, and the SD AT test of the array substrate.

Figure 4:
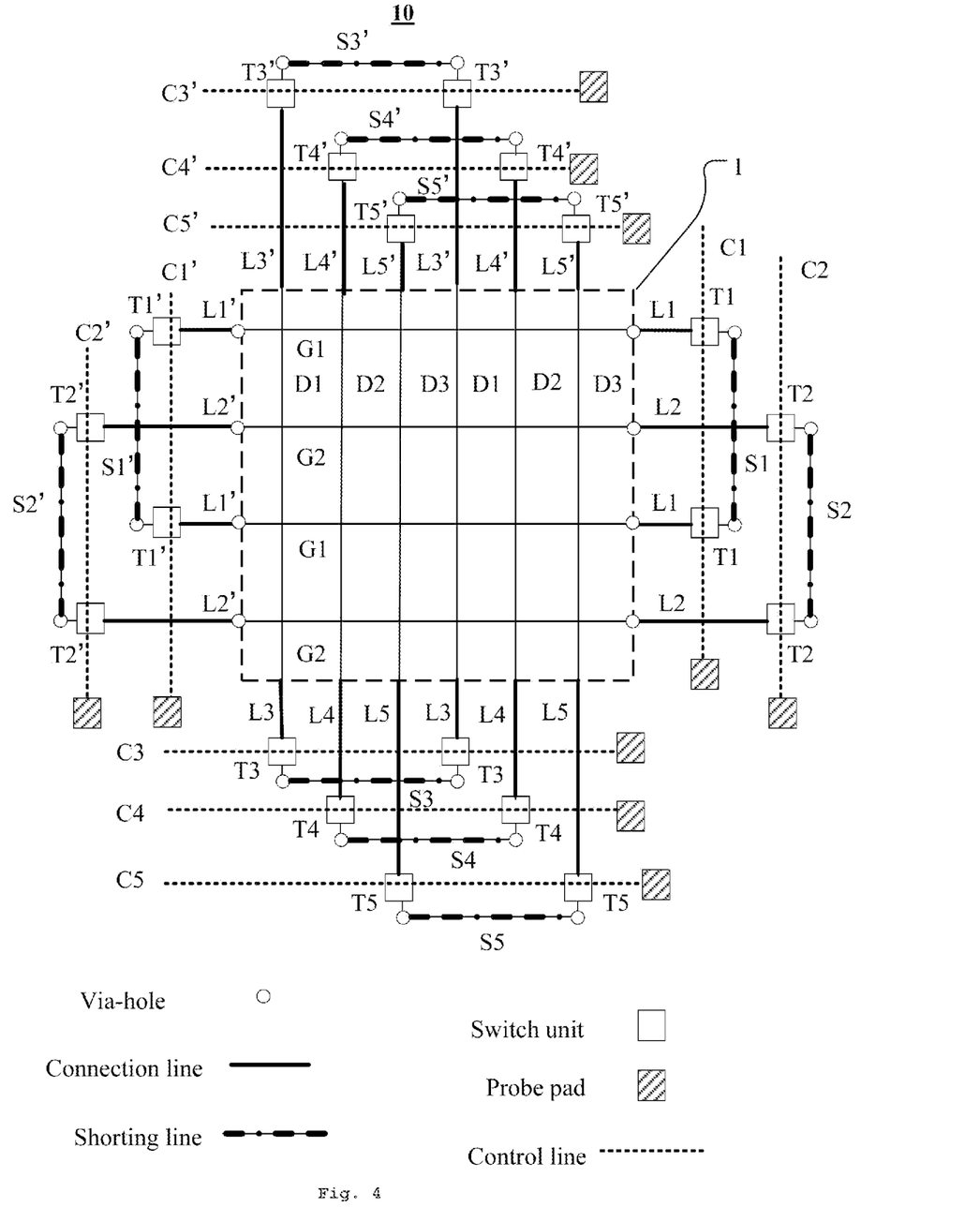
FIG. 4 is a structural schematic diagram illustrating another exemplary embodiment of a test circuit of the present disclosure.

As shown in FIG. 4, it is a structural schematic diagram illustrating another exemplary embodiment of the test circuit of the present disclosure. The array substrate 10 may include a display region 1 and a wiring region located in periphery of the display region 1. The switch units T1, the switch units T1', the switch units T2, the switch units T2', the switch units T3, the switch units T3', the switch units T4, the switch units T4', the switch units T5 and the switch units T5' may be provided in the wiring region, so as to avoid that the test circuit influences the production and operation of the circuits in the display region. A connection line L1 may be provided between the switch unit T1 and the first end of the first gate line G1, and the first terminal of the switch unit T1 is connected to the first end of the first gate line G1 via the connection line L1. A connection line L1' may be provided between the switch unit T1' and the second end of the first gate line G1, and the first terminal of the switch unit T1' is connected to the second end of the first gate line G1 via the connection line L1'. A connection line L2 may be provided between the switch unit T2 and the first end of the second gate line G2, and the first terminal of the switch unit T2 is connected to the first end of the second gate line G2 via the connection line L2. A connection line L2' may be provided between the switch unit T2' and the second end of the second gate line G2, and the first terminal of the switch unit T2' is connected to the second end of the second gate line G2 via the connection line L2'. A connection line L3 may be provided between the switch unit T3 and the first end of the first data line D1, and the first terminal of the switch unit T3 is connected to the first end of the first data line D1 via the connection line L3. A connection line L3' may be provided between the switch unit T3' and the second end of the first data line D1, and the first terminal of the switch unit T3' is connected to the second end of the first data line D1 via the connection line L3'. A connection line L4 may be provided between the switch unit T4 and the first end of the second data line D2, and the first terminal of the switch unit T4 is connected to the first end of the second data line D2 via the connection line L4. A connection line L4' may be provided between the switch unit T4' and the second end of the second data line D2, and the first terminal of the switch unit T4' is connected to the second end of the second data line D2 via the connection line L4'. A connection line L5 may be provided between the switch unit T5 and the first end of the third data line D3, and the first terminal of the switch unit T5 is connected to the first end of the third data line D3 via the connection line L5. A connection line L5' may be provided between the switch unit T5' and the second end of the third data line D3, and the first terminal of the switch unit T5' is connected to the second end of the third data line D3 via the connection line L5'.

In this exemplary embodiment, the switch units T1, the switch units T1', the switch units T2, the switch units T2', the switch units T3, the switch units T3', the switch units T4, the switch units T4', the switch units T5 and the switch units T5' may be provided on the same layer as other transistors in the display region, thereby simplifying the manufacturing processes of the switch units in the test circuit. Source/drain terminals of the switch units T1, the switch units T1', the switch units T2, the switch units T2', the switch units T3, the switch units T3', the switch units T4, the switch units T4', the switch units T5 and the switch units T5' are located on the same layer as a source/drain layer of the array substrate. The connection lines L1, L1', L2, L2', L3, L3', L4, L4', L5 and L5' may be located in the source/drain layer of the array substrate, such that they are formed on the same layer as the source/drain electrodes of the switch units T1, the switch units T1', the switch units T2, the switch units T2', the switch units T3, the switch units T3', the switch units T4, the switch units T4', the switch units T5 and the switch units T5', that is, they are formed under a single patterning process. Accordingly, since the first gate lines G1 and the second gate lines G2 are located in a gate electrode layer of the array substrate, the connection lines L1 and L1' are connected to the first gate lines G1 through via-holes; and the connection lines L2 and L2' are connected to the second gate lines G2 through via-holes. As the first data lines D1, the second data lines D2 and the third data lines D3 are provided on the same layer as the source/drain layer of the array substrate, the connection lines L3, L3', L4, L4', L5 and L5' may be formed on the same layer as the first data lines D1, the second data lines D2 and the third data lines D3.

As shown in FIG. 4, the test circuit further includes shorting lines S1, S1', S2, S2', S3, S3', S4, S4', S5 and S5'. The shorting lines S1, S1' are provided corresponding to the first gate lines G1, the shorting lines S2, S2' are provided corresponding to the second gate lines G2, the shorting lines S3, S3' are provided corresponding to the first data lines D1, the shorting lines S4, S4' are provided corresponding to the second data lines D2, and the shorting lines S5, S5' are provided corresponding to the third data lines D3. The shorting line S1 is connected to the second terminals of the plurality of switch units T1, the shorting line S1' is connected to the second terminals of the plurality of switch units T1', the shorting line S2 is connected to the second terminals of the plurality of switch units T2, the shorting line S2' is connected to the second terminals of the plurality of switch units T2', the shorting line S3 is connected to the second terminals of the plurality of switch units T3, the shorting line S3' is connected to the second terminals of the plurality of switch units T3', the shorting line S4 is connected to the second terminals of the plurality of switch units T4, the shorting line S4' is connected to the second terminals of the plurality of switch units T4', the shorting line S5 is connected to the second terminals of the plurality of switch units T5, and the shorting line S5' is connected to the second terminals of the plurality of switch units T5'.

As shown in FIG. 4, if the shorting lines S1, S1', S2, and S2' are provided on the same layer as the connection lines L1, L L2, and L2', there is inevitably a crossover structure among the shorting lines S1, S1', S2, and S2' and the connection lines L1, L1', L2, and L2', which leads to short-circuiting of the shorting line and the connection line which are not correspondingly provided, for example, in FIG. 4, the shorting line S1 and the connection line L2 will be short-circuited. Similarly, if the shorting lines S3, S3', S4, S4', S5, and S5' are provided on the same layer as the connection lines L3, L3', L4, L4', L5, and L5', there is inevitably a crossover structure among the shorting lines S3, S3', S4, S4', S5, and S5' and the connection lines L3, L3', L4, L4', L5, and L5', which leads to short-circuiting of the shorting line and the connection line which are not provided correspondingly, for example, the shorting line S3 and the connection line L4 will be short-circuited. Therefore, the shorting lines S1, S1', S2, and S2' may be located on other conductive layers than the source/drain layer of the array substrate, and connected to the corresponding connection lines L1, L1', L2, and L2' through via-holes. The shorting lines S3, S3', S4, S4', S5, and S5' may be located on other conductive layers than the source/drain layer of the array substrate, and connected to the connection lines L3, L3', L4, L4', L5, and L5' through via-holes. The shorting lines S1, S1', S2, S2', S3, S3', S4, S4', S5, and S5' may be the gate electrode layer of the array substrate. It should be understood that the shorting lines S1, S1', S2, S2', S3, S3', S4, S4', S5, and S5' may be located in other conductive layers of the array substrate as well, for example, an active layer.

As shown in FIG. 4, the test circuit may further include control lines C1, C1', C2, C2', C3, C3', C4, C4', C5, and C5'. The control lines C1 and C1' are provided corresponding to the first gate lines G1, the control lines C2 and C2' are provided corresponding to the second gate lines G2, the control lines C3 and C3' are provided corresponding to the first data lines D1, the control lines C4 and C4' are provided corresponding to the second data lines D2, and the control lines C5 and C5' are provided corresponding to the third data lines D3. The control line C1 is connected to the control terminals of the plurality of switch units T1, the control line C2 is connected to the control terminals of the plurality of switch units T2, the control line C3 is connected to the control terminals of the plurality of switch units T3, the control line C4 is connected to the control terminals of the plurality of switch units T4, the control line C5 is connected to the control terminals of the plurality of switch units T5, the control line C1' is connected to the control terminals of the plurality of switch units T1', the control line C2' is connected to the control terminals of the plurality of switch units T2', the control lines C3' is connected to the control terminals of the plurality of switch units T3', the control line C4' is connected to the control terminals of the plurality of switch units T4', and the control line C5' is connected to the control terminals of the plurality of switch units T5'. The control lines C1, C1', C2, C2', C3, C3', C4, C4', C5, and C5' provide control signals to the control terminals of the switch units T1, T1', T2, T2', T3, T3', T4, T4', T5, and T5' respectively. The control lines C1, C1', C2, C2', C3, C3', C4, C4', C5, and C5' may be located in the gate electrode layer of the array substrate.

As shown in FIG. 4, a plurality of probe pads may be provided on a surface of the array substrate, and the probe pads may be provided in one-to-one correspondence with the control lines C1, C1', C2, C2', C3, C3', C4, C4', C5, and C5'. The plurality of probe pads may be connected to the control lines C1, C1', C2, C2', C3, C3', C4, C4', C5, and C5' through the via-holes, respectively. An external circuit may input control signals to the control lines through the probe pads.

This exemplary embodiment further provides an array substrate including the test circuit described above.

In this exemplary embodiment, the pixel drive circuit in the array substrate may include a storage capacitor (such as C in FIG. 2) and a drive transistor (such as DT in FIG. 2), wherein an electrode (i.e. the electrode connected to point S) of the storage capacitor connected to the source/drain electrode of the drive transistor is located in the source/drain layer of the array substrate. As shown in FIG. 2, the SD AT test is intended to detect the state of the array substrate by detecting the voltage at point S, the electrode of the storage capacitor connected to the source/drain electrode of the drive transistor is positioned at the source/drain layer of the array substrate. Since the source/drain layer is located at an upper layer of the conductive layer of the array substrate, it is possible to detect the voltage at point S by detecting a voltage of the electrode of the capacitor in the source/drain layer. Since the electrode of the capacitor has a large area, the signal pulse detected by the detection tool may be enhanced.

This exemplary embodiment further provides a display panel including the array substrate described above.

The display panel provided in the present disclosure has the same technical features and operating principles as the array substrate described above, the foregoing contents have been described in detail and will not be repeated here.

Other embodiments of the disclosure will be apparent to those skilled in the art from consideration of the specification and practice of the disclosure disclosed here. This application is intended to cover any variations, uses, or adaptations of the disclosure following the general principles thereof and including such departures from the present disclosure as come within known or customary practice in the art. It is intended that the specification and examples be considered as exemplary only, with a true scope and spirit of the disclosure being indicated by the following claims.

It will be appreciated that the present disclosure is not limited to the exact construction that has been described above and illustrated in the accompanying drawings, and that various modifications and changes can be made without departing from the scope thereof. It is intended that the scope of the disclosure only be limited by the appended claims.

What is claimed is:

1. A test circuit configured to be applied to an array substrate, wherein:
   the array substrate comprises a plurality of signal lines;
   the test circuit comprises a plurality of first switch units and a plurality of second switch units provided in one-to-one correspondence with the plurality of signal lines;
   the plurality of first switch units are provided in one-to-one correspondence with the plurality of signal lines, first terminals of the plurality of first switch units are connected to first ends of the plurality of signal lines, second terminals of the plurality of first switch units are short-circuited to one another, and control terminals of the plurality of first switch units are connected to a first control signal terminal;
   the plurality of second switch units are provided in one-to-one correspondence with the plurality of signal lines, first terminals of the plurality of second switch units are connected to second ends of the plurality of signal lines, second terminals of the plurality of second switch units are short-circuited to one another, and control terminals of the plurality of second switch units are connected to a second control signal terminal;
   the array substrate comprises a wiring region located in periphery of a display region, and the plurality of first switch units and the plurality of second switch units are provided in the wiring region;
   the test circuit further comprises first connection lines, each of the first connection lines is provided between one of the plurality of first switch units and one of the plurality of signal lines, and the first connection line is connected between the first terminal of the first switch unit and the one of the plurality of signal lines;
   the test circuit further comprises second connection lines, each of the second connection lines is provided between one of the plurality of second switch units and one of the plurality of signal lines, and the second connection line is connected between the first terminal of the second switch unit and the one of the plurality of signal lines;
   the test circuit further comprises first shorting lines and second shorting lines;
   the first shorting lines are located on a first conductive layer of the array substrate, and each of the first shorting lines is connected through a via-hole to the second terminals of the first switch units corresponding to the first shorting line;
   the second shorting lines are located on the first conductive layer of the array substrate, and each of the second shorting lines is connected through a via-hole to the second terminals of the second switch units corresponding to the second shorting line; and
   the first connection lines and the second connection lines are provided in a different layer than the first shorting lines and the second shorting lines.

2. The test circuit according to claim 1, wherein the first connection lines and the second connection lines are provided in the wiring region.

3. The test circuit according to claim 2, wherein:
   the first switch units comprise first transistors, wherein first terminals of the first transistors are connected to the first ends of the plurality of signal lines, second terminals of the first transistors are short-circuited to one another, and control terminals of the first transistors are connected to the first control signal terminal; and
   the plurality of second switch units comprise second transistors, wherein first terminals of the second transistors are connected to the second ends of the plurality of signal lines, second terminals of the second transistors are short-circuited to one another, and control terminals of the second transistors are connected to the second control signal terminal.

4. The test circuit according to claim 3, wherein the first transistors and the second transistors are provided on a same layer as transistors in the display region.

5. The test circuit according to claim 1, wherein the first connection lines and the second connection lines are connected to the signal lines through via-holes.

6. The test circuit according to claim 1, wherein:
the test circuit further comprises first control lines and second control lines provided in one-to-one correspondence with the plurality of signal lines;
the first control lines are connected to the control terminals of the plurality of first switch units; and
the second control lines are connected to the control terminals of the plurality of second switch units.

7. The test circuit according to claim 6, wherein:
the test circuit further comprises a plurality of first probe pads and a plurality of second probe pads provided in one-to-one correspondence with the plurality of signal lines;
the plurality of first probe pads are provided on a surface of the array substrate, and are connected to the first control lines; and
the plurality of second probe pads are provided on the surface of the array substrate, and are connected to the second control lines.

8. The test circuit according to claim 1, wherein the plurality of signal lines comprise gate lines, data lines, or a combination of the gate lines and the data lines.

9. An array substrate, comprising:
a plurality of signal lines;
a test circuit comprising a plurality of first switch units and a plurality of second switch units provided in one-to-one correspondence with the plurality of signal lines, wherein:
the plurality of first switch units are provided in one-to-one correspondence with the plurality of signal lines, first terminals of the plurality of first switch units are connected to first ends of the plurality of signal lines, second terminals of the plurality of first switch units are short-circuited to one another, and control terminals of the plurality of first switch units are connected to a first control signal terminal;
the plurality of second switch units are provided in one-to-one correspondence with the plurality of signal lines, first terminals of the plurality of second switch units are connected to second ends of the plurality of signal lines, second terminals of the plurality of second switch units are short-circuited to one another, and control terminals of the plurality of second switch units are connected to a second control signal terminal;
the array substrate comprises a wiring region located in periphery of a display region, the plurality of first switch units and the plurality of second switch units are provided in the wiring region;
the test circuit further comprises first connection lines, each of the first connection lines is provided between one of the plurality of first switch units and one of the plurality of signal lines, and the first connection line is connected between the first terminal of the first switch unit and the one of the plurality of signal lines;
the test circuit further comprises second connection lines, each of the second connection lines is provided between one of the plurality of second switch units and one of the plurality of signal lines, and the second connection line is connected between the first terminal of the second switch unit and the one of the plurality of signal lines;
the test circuit further comprises first shorting lines and second shorting lines;
the first shorting lines are located on a first conductive layer of the array substrate, and each of the first shorting lines is connected through a via-hole to the second terminals of the first switch units corresponding to the first shorting line;
the second shorting lines are located on the first conductive layer of the array substrate, and each of the second shorting lines is connected through a via-hole to the second terminals of the second switch units corresponding to the second shorting line; and
the first connection lines and the second connection lines are provided in a different layer than the first shorting lines and the second shorting lines.

10. The array substrate according to claim 9, wherein:
a pixel drive circuit in the array substrate comprises a storage capacitor and a drive transistor.

11. The array substrate according to claim 9, wherein:
the test circuit comprises first control lines and second control lines provided in one-to-one correspondence with the plurality of signal lines;
the first control lines are connected to the control terminals of the plurality of first switch units; and
the second control lines are connected to the control terminals of the plurality of second switch units.

12. The array substrate according to claim 11, wherein:
the test circuit further comprises a plurality of first probe pads and a plurality of second probe pads provided in one-to-one correspondence with the plurality of signal lines;
the plurality of first probe pads are provided on a surface of the array substrate, and are connected to the first control lines; and
the plurality of second probe pads are provided on the surface of the array substrate, and are connected to the second control lines.

13. The array substrate according to claim 9, wherein the plurality of signal lines comprise gate lines, data lines, or a combination of the gate lines and the data lines.

14. A display panel, comprising:
an array substrate, comprising:
a plurality of signal lines;
a test circuit comprising a plurality of first switch units and a plurality of second switch units provided in one-to-one correspondence with the plurality of signal lines, wherein:
the plurality of first switch units are provided in one-to-one correspondence with the plurality of signal lines, first terminals of the plurality of first switch units are connected to first ends of the plurality of signal lines, second terminals of the plurality of first switch units are short-circuited to one another, and control terminals of the plurality of first switch units are connected to a first control signal terminal;
the plurality of second switch units are provided in one-to-one correspondence with the plurality of signal lines, first terminals of the plurality of second switch units are connected to second ends of the plurality of signal lines, second terminals of the plurality of second switch units are short-circuited to one another, and control terminals of the plurality of second switch units are connected to a second control signal terminal;
the array substrate comprises a wiring region located in periphery of a display region, and the plurality of first switch units and the plurality of second switch units are provided in the wiring region;
the test circuit further comprises first connection lines, each of the first connection lines is provided between one of the plurality of first switch units and one of the plurality of signal lines, and the first connection line is connected between the first terminal of the first switch unit and the one of the plurality of signal lines;

the test circuit further comprises second connection lines, each of the second connection lines is provided between one of the plurality of second switch units and one of the plurality of signal lines, and the second connection line is connected between the first terminal of the second switch unit and the one of the plurality of signal lines;

the test circuit further comprises first shorting lines and second shorting lines;

the first shorting lines are located on a first conductive layer of the array substrate, and each of the first shorting lines is connected through a via-hole to the second terminals of the first switch units corresponding to the first shorting line;

the second shorting lines are located on the first conductive layer of the array substrate, and each of the second shorting lines is connected through a via-hole to the second terminals of the second switch units corresponding to the second shorting line; and the first connection lines and the second connection lines are provided in a different layer than the first shorting lines and the second shorting lines.

15. The display panel according to claim 14, wherein:

the test circuit comprises first control lines and second control lines provided in one-to-one correspondence with the plurality of signal lines;

the first control lines are connected to the control terminals of the plurality of first switch units; and the second control lines are connected to the control terminals of the plurality of second switch units.

16. The display panel according to claim 15, wherein:

the test circuit further comprises a plurality of first probe pads and a plurality of second probe pads provided in one-to-one correspondence with the plurality of signal lines;

the plurality of first probe pads are provided on a surface of the array substrate, and are connected to the first control lines; and the plurality of second probe pads are provided on the surface of the array substrate, and are connected to the second control lines.

17. The display panel according to claim 14, wherein the plurality of signal lines comprise gate lines, data lines, or a combination of the gate lines and the data lines.

* * * * *